US006938230B2

(12) United States Patent
Frank et al.

(10) Patent No.: US 6,938,230 B2
(45) Date of Patent: Aug. 30, 2005

(54) SYSTEM AND METHOD FOR EVALUATING SIGNAL TRACE DISCONTINUITIES IN A PACKAGE DESIGN

(75) Inventors: Mark D. Frank, Longmont, CO (US); Jerimy Nelson, Fort Collins, CO (US); David W. Quint, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 128 days.

(21) Appl. No.: 10/368,778

(22) Filed: Feb. 19, 2003

(65) Prior Publication Data

US 2004/0163057 A1 Aug. 19, 2004

(51) Int. Cl.[7] .............................................. G06F 17/50
(52) U.S. Cl. ............................................... 716/4; 716/5
(58) Field of Search ........................................ 716/4, 5

(56) References Cited

U.S. PATENT DOCUMENTS 5,610,833 A * 3/1997 Chang et al. ................. 716/11
5,808,529 A * 9/1998 Hamre ........................ 333/246

OTHER PUBLICATIONS

Wing,"On VLSI Interconnects",Jun. 1991, IEEE Conference Proceedings, International Conference on Circuits and System, vol. 2, pp. 991–996.*

Venkataraman et al.,"Effects of Discontinuities (Vias) on High Speed Interconnects", Nov. 1994, IEEE 3rd Topical Meeting on Electrical Performance of Electronic Packaging, pp. 79–82.*

Boussetta et al., "Modeling of Multiconductor Microstrip Bend Discontinuities" Nov. 1994, IEEE 3rd Topical Meeting on Electrica Performance of Electronic Packaging, pp. 148–150.*

Kergonou et al.,"Frequency Dependence in High Speed Interconnections", Aug. 2001, IEEE International Symposium on Electromagnetic Compatibility, vol. 1, pp. 632–634.*

* cited by examiner

Primary Examiner—Stacy A. Whitmore
Assistant Examiner—Sun James Lin

(57) ABSTRACT

A method evaluates signal trace discontinuities in an electronic design of the type having one or more traces. The method includes the steps of formulating one or more trace discontinuity rules, processing the electronic design to determine whether the traces violate the trace discontinuity rules, and generating an indicator (e.g., a DRC) associated with the electronic design to identify violated trace discontinuity rules. Each level, each signal net, or a group of signal nets may be evaluated, for example, to ensure compliance with the trace discontinuity rules.

11 Claims, 9 Drawing Sheets

SYSTEM AND METHOD FOR EVALUATING SIGNAL TRACE DISCONTINUITIES IN A PACKAGE DESIGN

RELATED APPLICATIONS

This application is related to the following commonly owned and co-filed U.S. Patent applications, each of which is incorporated herein by reference: U.S. patent application Ser. No. 10/368,988, filed Feb. 19, 2003, entitled: SYSTEM AND METHOD FOR EVALUATING VIAS PER PAD IN A PACKAGE DESIGN; U.S. patent application Ser. No. 10/368,837, filed Feb. 19, 2003, entitled: SYSTEM AND METHOD FOR EVALUATING SIGNAL COUPLING BETWEEN DIFFERENTIAL TRACES IN A PACKAGE DESIGN; U.S. patent application Ser. No. 10/368,789, filed Feb. 19, 2003, entitled: SYSTEM AND METHOD FOR EVALUATING POWER AND GROUND VIAS IN A PACKAGE DESIGN; U.S. patent application Ser. No. 10/368,776, filed Feb. 19, 2003, entitled: SYSTEM AND METHOD FOR EVALUATING SIGNAL COUPLING BETWEEN VIAS IN A PACKAGE DESIGN; and U.S. patent application Ser. No. 10/368,758, entitled: SYSTEM AND METHOD FOR EVALUATING SIGNAL DEVIATIONS IN A PACKAGE DESIGN

BACKGROUND

Prior art computer aided design (CAD) software is known to include complimentary tool suites for designing and analyzing the package of a die, e.g., a microprocessor. A "package" is the physical interconnection between the die and, for example, a printed circuit board (PCB). A typical package has several interconnected levels between its top level (Level 1), which connects to the die, and its bottom level (Level 2), which connects to the PCB.

A package "design" is a hierarchical and symbolic digital model of the package circuit. Those skilled in the art appreciate that hardware description languages (HDLs) may be used to formulate this digital model. The digital model consists of linked design elements that simulate the package circuit. The design elements are for example digital representations of the transistors, resistors, logic gates, traces (i.e., intra-level conductors), capacitors, vias (i.e., inter-level connectors), and wire bonds that make up the simulated schematic circuit.

The design elements and interconnections are collated and defined in a design database, which is a textual representation package design. The design database may further describe the package design in terms of higher-level cells consisting of two or more design elements, and the connections between cells. Each "net" in the package design describes the linked conductors (e.g., traces of a level and vias between levels) that form a circuit between an input and an output of the package. The CAD software may automatically route traces within a given level of the package design.

The design database is processed by the CAD software to perform circuit simulation. The CAD software is for example used to model a signal through the package and over a net (i.e., a "signal net"). Substrate laminate technologies and bond interconnections may also be evaluated through the CAD software.

One exemplary prior art CAD software is Advanced Package Designer (APD) from Cadence Design Systems, Inc., of San Jose, Calif. Such CAD software is known to include verification procedures and dynamic feedback that evaluate design accuracy against a set of physical and electrical design rules, or constraints. Physical design constraints help to ensure manufacturability; electrical design constraints help to ensure electrical specifications of the design. In one example, this CAD software generates a Design Rule Check (DRC) indicating whether the design meets the various constraints. The prior art CAD software also provides a graphical user interface to view all or part of the package design in two dimensions, for example in a flat or perspective rendition, or with levels overlaid relative to one another.

FIG. 1 illustrates one prior art system 10 for designing a package with prior art CAD software 12. CAD software 12 is stored within a computer 14, initially within a storage unit 16. A processor 18 of computer 14 operates CAD software in response to user inputs at an input interface 20 (e.g., a computer keyboard and mouse). As those skilled in the art appreciate, when initialized, CAD software 12 may also load into internal memory 22 of computer 14. A human designer at input interface 20 may then control CAD software 12, through processor 18, to create a package design 24, also stored within memory 22. The designer can command processor 18 and CAD software 12 to graphically show package design 24 in various formats at a graphical user interface 26 (e.g., a computer monitor) of system 10. Illustratively, package design 24 is graphically depicted on a display 28 of graphical user interface 26 as a five-level package model 24A, which is shown in greater detail in FIG. 2. L1 of model 24A couples with a die, and L2 of model 24A couples with a PCB. Levels I(1), I(2) and (3) of model 24A represent intermediate levels of package design 24. Levels L1, I(1), I(2), I(3), L2 are shown as distinct elements and with not-to-scale orientations for ease of illustration.

An illustrative signal net 30 is shown from an input connector 32 to an output connector 34 of model 24A. Signal net 30 traverses design elements in the form of traces and vias between connectors 32, 34: via 35 from connector 32 of L1 to trace 36 of I(1); trace 36 within I(1) from via 35 to via 38; via 38 from trace 36 of I(1) to trace 40 of I(2); trace 40 within I(2) from via 38 to via 42; via 42 from trace 40 of I(2) to trace 44 of I(3); trace 44 within I(3) from via 42 to via 46, which terminates at connector 34 of L2.

CAD software 12 is also operable to generate a design database 50. In one example, design database 50 textually defines signal net 30, including connectors 32, 34, traces 36, 40, 44, and vias 35, 38, 42, 46. Design database 50 includes parameters (often called a "netlist") to ensure that signal net 30 has a start and end point 32, 34, respectively. A designer can manipulate design database 50 to develop the desired package design 24.

CAD software 12 utilizes design rules 52 to generate one or more DRCs 54 in the event that a design element or signal net of package design 24 exceeds a manufacturing constraint or electrical specification. By way of example, design rules 52 may specify that a trace width of trace 36 is 20 $\mu$m, to ensure manufacturability. If a designer of system 10 implements trace 36 with 10 $\mu$m, for example, then CAD software 12 generates a DRC 54A, which may be graphically displayed on model 24A, as shown. The user is thus made aware that a problem may exist with trace 36.

FIG. 2 shows model 24A in greater detail, and further illustrates that traces 36, 40, 44 may include one or more discontinuities 56. Discontinuities 56 are for example "bends" or "angles" of a trace that are implemented by a designer, or by CAD software 12, to route the trace within a given level. As such, traces 36, 40, 44 are segmented into multiple design elements, as shown: trace 36 is segmented into trace 36A, 36B, 36C; trace 40 is segmented into trace 40A, 40B, and trace 44 is segmented into trace 44A, 44B.

Those skilled in the art appreciate that package design 24 often has more than the five levels illustrated in model 24A; however only five levels are shown for ease of illustration. For example, it is common that package design 24 include ground levels between each level with signal traces (I(1), I(2) and I(3); however these ground levels are not shown to simplify illustration. Those skilled in the art also appreciate that package design 24 also typically has many more signal nets and other design elements than the single illustrated signal net 30. For example, package design 24 typically includes many other traces and vias (not shown) within package model 24A.

FIG. 3 illustrates package model 24A in a side view. FIG. 3 further illustrates how package design 24 connects between a die 60 and PCB 62. Connector 32 is for example a pad that connects with a solder ball 61 of die 60; connector 34 is for example a pad that connects with signal wires of PCB 62.

The increased complexity of the modem die has correspondingly increased the complexity of the package design. An example of a complex die includes a Precision Architecture—Reduced Instruction Set Computer (PA-RISC) processor produced by Hewlett Packard Corporation, which has over one billion components. The package for the PA-RISC processor must maintain high signal integrity through its signal nets; however the prior art CAD software does not simulate this signal integrity as required by the corresponding die. Accordingly, the package may be physically manufactured, at great expense, before the designer learns that the package is not suitable for operation with the die. Moreover, while the DRCs generated by the prior art CAD software may assist in manufacturability; they do not, however, warn the designer of signal net incompatibilities between the die and the package. By way of example, prior art CAD software 12 does not evaluate discontinuities 56 of design 24. Each discontinuity 56 may however cause signal reflections and delays that seriously impact signal integrity from die 60 to PCB 62.

SUMMARY OF THE INVENTION

In one aspect, a method evaluates signal trace discontinuities in an electronic design of the type having one or more traces. The method includes the steps of: formulating one or more trace discontinuity rules; processing the electronic design to determine whether the traces violate the trace discontinuity rules; and generating an indicator (e.g., a DRC) associated with the electronic design to identify violated trace discontinuity rules.

In one aspect, the step of processing includes the step of processing one level of the electronic design for violation of the trace discontinuity rules. In another aspect, the step of processing includes the step of processing one signal net of the electronic design for violation of the trace discontinuity rules.

In another aspect, the electronic design is a package design, and the step of formulating includes the step of formulating one or more group trace discontinuity rules for a group of signal nets of the package design. In this aspect, the step of processing includes the step of processing the group of signal nets to determine whether traces of the group of signal nets violate the group trace discontinuity rules. A DRC may be generated for each violation of the group trace discontinuity rules.

In another aspect, the step of processing the group of signal nets includes the steps of locating one signal net within the group which has a least number of trace discontinuities, and then evaluating each other signal net in the group as to whether each other signal net violates the group trace discontinuity rules. In one example, the method determines whether one signal net has more than X trace discontinuities (e.g., six trace discontinuities) that have a turning angle greater than Y degrees (e.g., thirty degrees), as compared to any other signal net within the group. X is an integer greater than or equal to one; Y is an integer greater than or equal to ten.

In another aspect, the step of generating an indicator includes the step of graphically depicting a DRC on a graphical user interface illustrating the electronic design.

In still another aspect, the electronic design is a package design, and the step of processing includes the step of processing all levels of the package design for violation of the trace discontinuity rules.

In another aspect, the step of processing includes determining a number of trace discontinuities within signal nets of the electronic design.

A software product is also provided. The software product has instructions, stored on computer-readable media, wherein the instructions, when executed by a computer, perform steps for determining signal trace discontinuities in an electronic design, including: determining instances of trace discontinuities within the electronic design; comparing the instances to one or more trace discontinuity rules; and generating an indicator identifying violations of the trace discontinuity rules. The software product may further include instructions for formulating one or more of the trace discontinuity rules. The software product may also include determining whether one signal net in a group of signal nets exceeds a threshold of trace discontinuities. The threshold is a set number of trace discontinuities per signal net that exceed a set turning angle.

In another aspect, the software product includes instructions for counting trace discontinuities within the electronic design and determining a turning angle for each of the trace discontinuities.

Various ones of the methods, systems and products herein may provide certain advantages. For example, a system configured with trace discontinuity software may thus count trace discontinuities in a package design, to match package performance to its corresponding die. By way of example, a die may require that a group of twenty data signals need to maintain similar electrical properties. In order to ensure this occurs, any given signal net of a package cannot have more than approximately six trace discontinuities that have a turning angle greater than thirty degrees; this construct is formulated into the trace discontinuity rules. According to certain methods herein, a designer may also use the system to locate the signal net with the fewest number of trace discontinuities and then check for other signal nets with additional violating trace discontinuities. In another example, all clock signals within a package must meet very high standards set by its corresponding die. Such a package may therefore be designed so that any trace discontinuity does not exceed a turning angle greater than thirty degrees. Certain processes herein count trace discontinuities, and further evaluate the turning angle of these discontinuities to ensure design goals are met. A designer may also define trace discontinuity rules as in the following examples: a trace may have not have a trace discontinuity with a turning angle of more than forty-five degrees; a trace may not have a trace discontinuity that has a turning angle of more than ninety degrees. The system then processes the package design, and indicates (e.g., by DRCs and/or a report) the traces that violate the trace discontinuity rules.

DETAILED DESCRIPTION OF THE DRAWINGS

Figure 1:
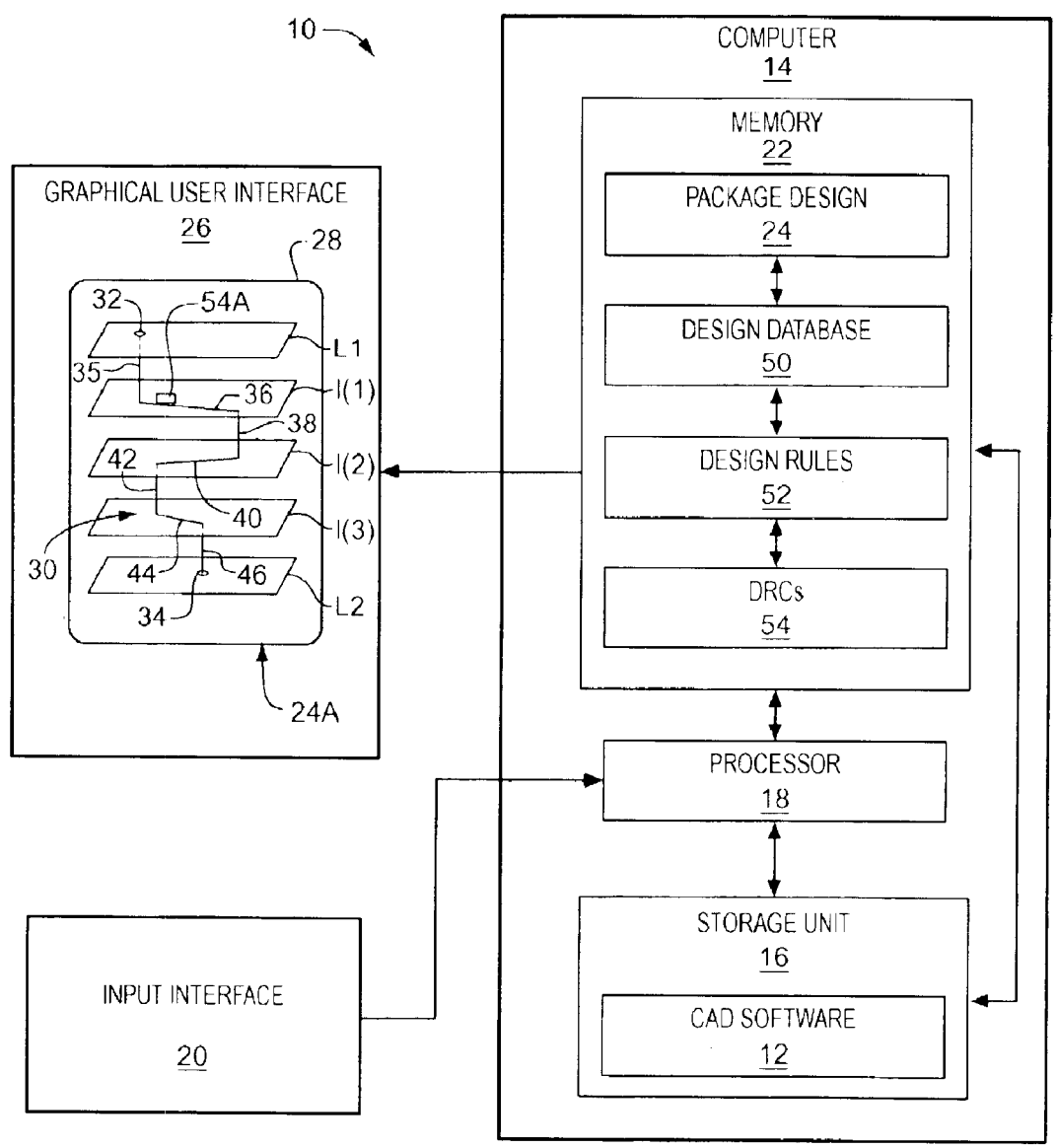
FIG. 1 shows a prior art system and CAD software for designing a package.
Figure 2:
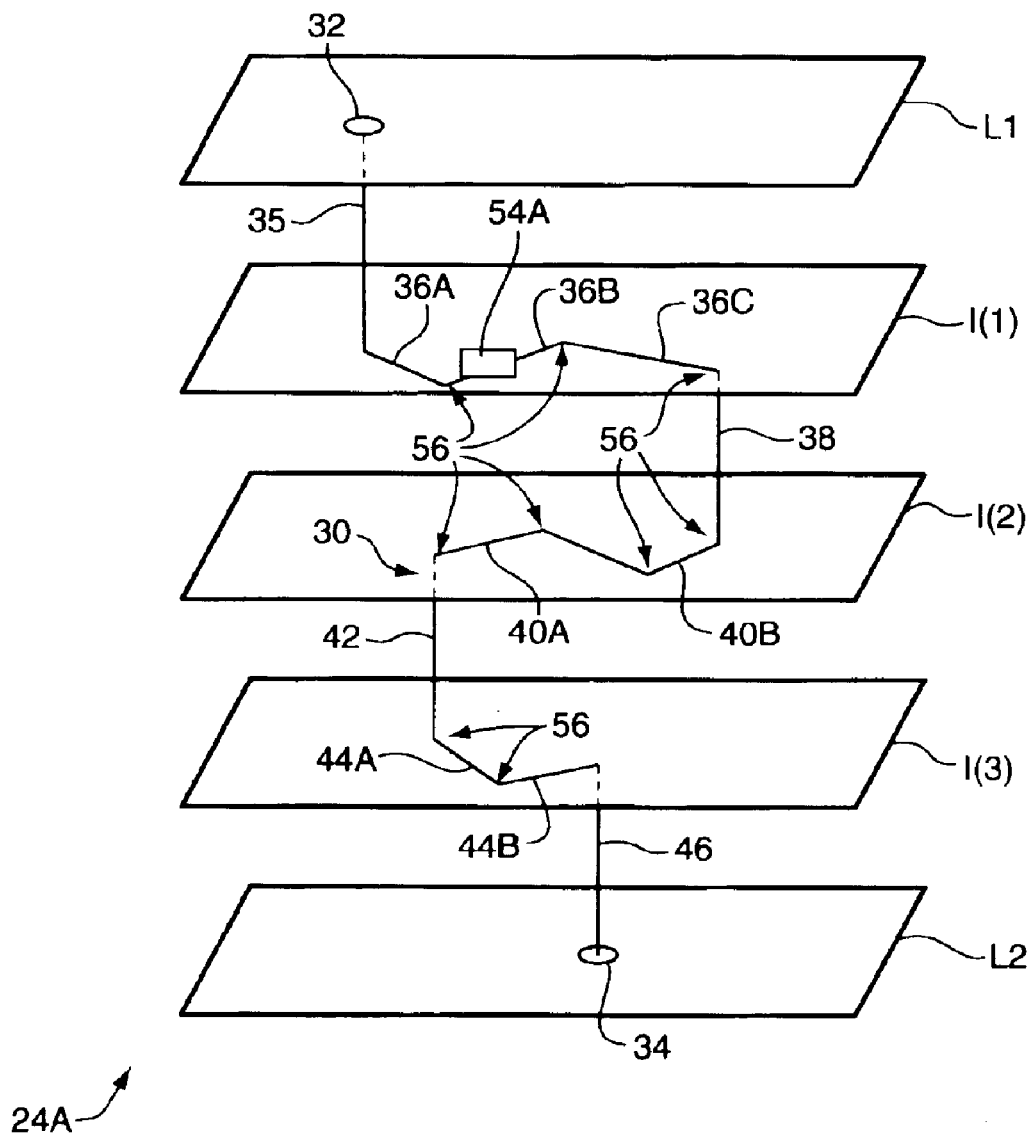
FIG. 2 shows, in a perspective 3D view, one illustrative graphical model of the package design of FIG. 1.
Figure 3:
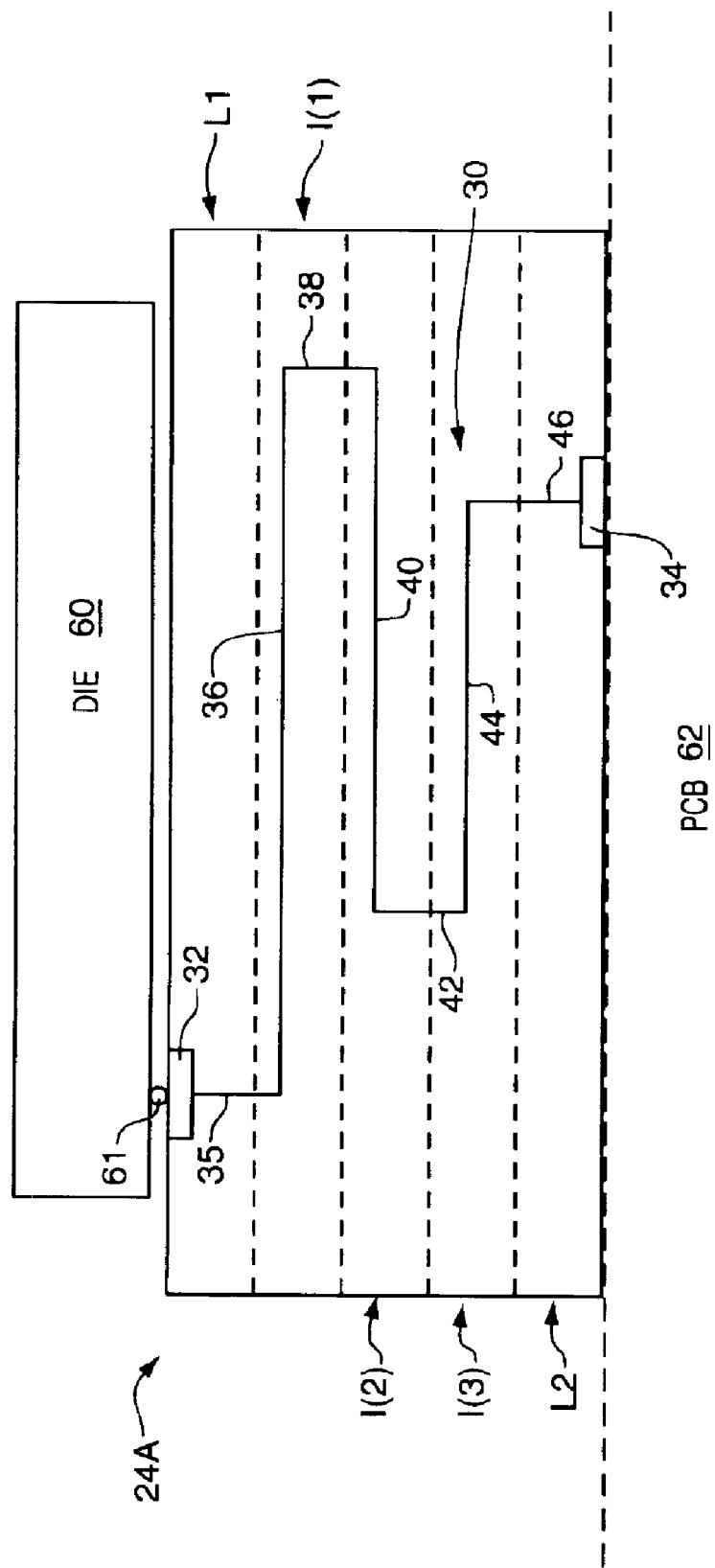
FIG. 3 shows the package design of FIG. 1 in a side view.
Figure 4:
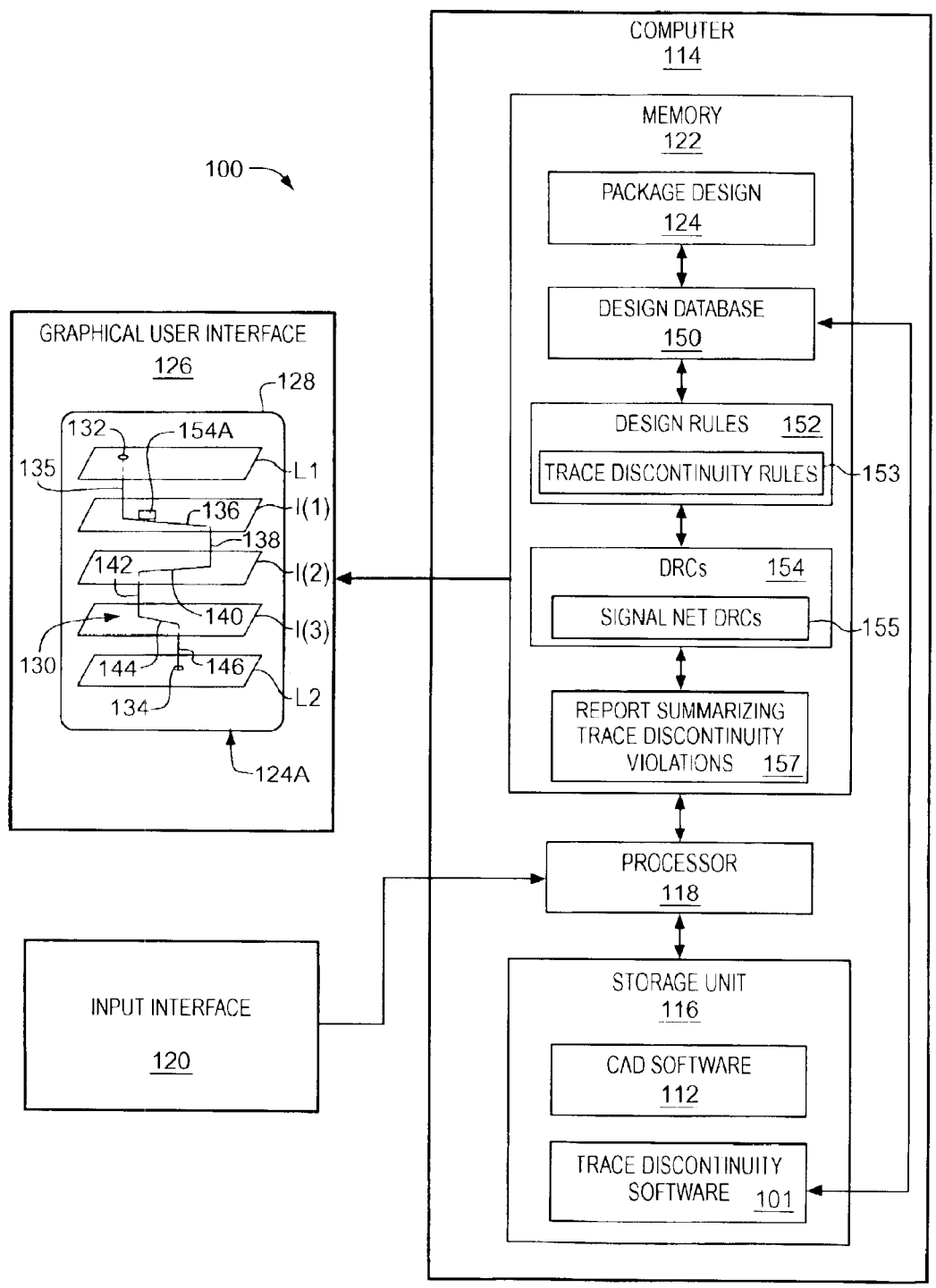
FIG. 4 shows one system for evaluating signal trace discontinuities in a package design.

FIG. 4 shows one system 100 for designing and evaluating a package design utilizing CAD software 112 and trace discontinuity software 101. CAD software 112 and trace discontinuity software 101 are stored within a computer 114, initially within a storage unit 116. A processor 118 of computer 114 operates CAD software 112 and trace discontinuity software 101 in response to user inputs at an input interface 120 (e.g., a computer keyboard and mouse). When initialized, CAD software 112 and trace discontinuity software 101 may load into internal memory 122 of computer 114 as sets of instructions. A human designer at input interface 120 may then control CAD software 112 and trace discontinuity software 101, through processor 118, to create a package design 124, also stored within memory 122. The designer can command processor 118 and CAD software 112 to graphically show package design 224 in one or more dimensions at a graphical user interface 126 (e.g., a computer monitor) of system 100. Illustratively, package design 124 is graphically depicted on a display 128 of graphical user interface 126 as a five-level package model 124A, which is shown in greater detail in FIG. 5. L1 of model 124A couples with a die, and L2 of model 124A couples with a PCB. Levels I(1), I(2) and (3) of model 124A represent intermediate levels of package design 124. Levels L1, I(1), I(2), I(3), L2 are shown as distinct elements and with not-to-scale orientations for ease of illustration.

An illustrative signal net 130 is shown from an input connector 132 to an output connector 134 of model 124A. Signal net 130 traverses design elements in the form of traces and vias between connectors 132, 134: via 135 from connector 132 of L1 to trace 136 of I(1); trace 136 within I(1) from via 135 to via 138; via 138 from trace 136 of I(1) to trace 140 of I(2); trace 140 within I(2) from via 138 to via 142; via 142 from trace 140 of I(2) to trace 144 of I(3); trace 144 within I(3) from via 142 to via 146, which terminates at connector 134 of L2.

CAD software 112 is operable to generate a design database 150. In one example, design database 150 textually defines signal net 130, including connectors 132, 134, traces 136, 140, 144, and vias 135, 138, 142, 146. Trace discontinuity software 101 is operable to process design database 150 to determine and evaluate trace discontinuities within package design 124. Design database 150 includes parameters (e.g., a netlist) to ensure that signal net 30 has a start and end point 132, 134, respectively. A designer can manipulate design database 150 to develop the desired package design 124. As a matter of design choice, trace discontinuity software 101 may be combined with CAD software 112.

Figure 5:
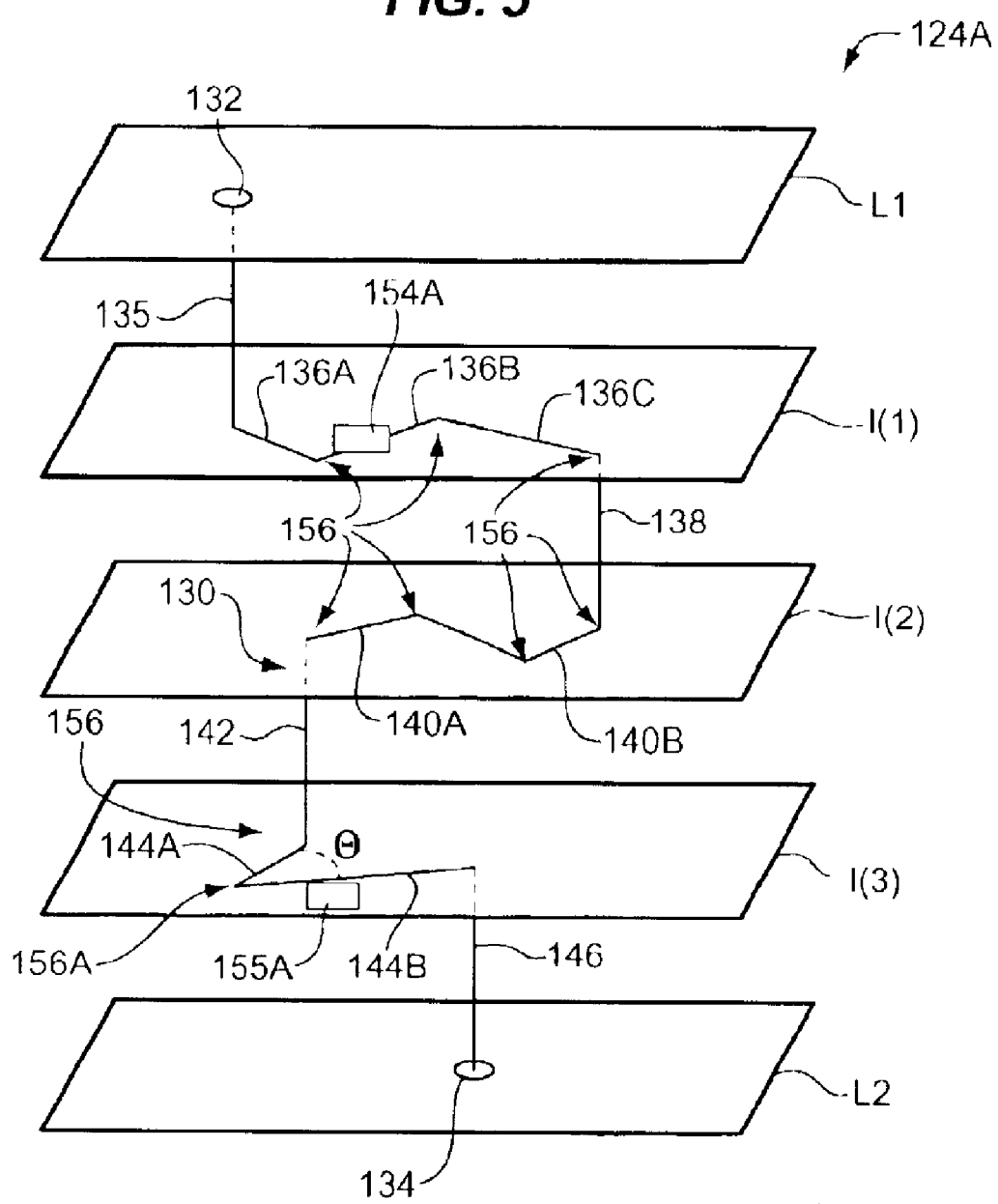
FIG. 5 illustrates one package design processed by the system of FIG. 4.

FIG. 5 shows model 124A in greater detail, and further illustrates that traces 136, 140, 144 may include one or more discontinuities 156. Discontinuities 156 are for example "bends" or "angles" of a trace that are implemented by a designer, or by CAD software 112, to route the trace within a given level. As such, traces 136, 140, 144 are segmented into multiple design elements, as shown: trace 136 is segmented into trace 136A, 136B, 136C; trace 140 is segmented into trace 140A, 140B, and trace 144 is segmented into trace 144A, 144B.

CAD software 112 processes design database 150 and utilizes design rules 152 to generate one or more Design Rule Checks (DRCs) 154 in the event that a design element or signal net of package design 124 exceeds a manufacturing constraint or electrical specification. One DRC 154A is illustratively shown in model 124A, for example illustrating non-manufacturability of a trace 136. A DRC 154 may also be a textual indicator, for example a statement written to a report 157, described below. Illustratively, such a textual DRC 154 may for example state: DRC 154A=trace 136 violates physical constraint of 20 $\mu$m.

Figure 8A:
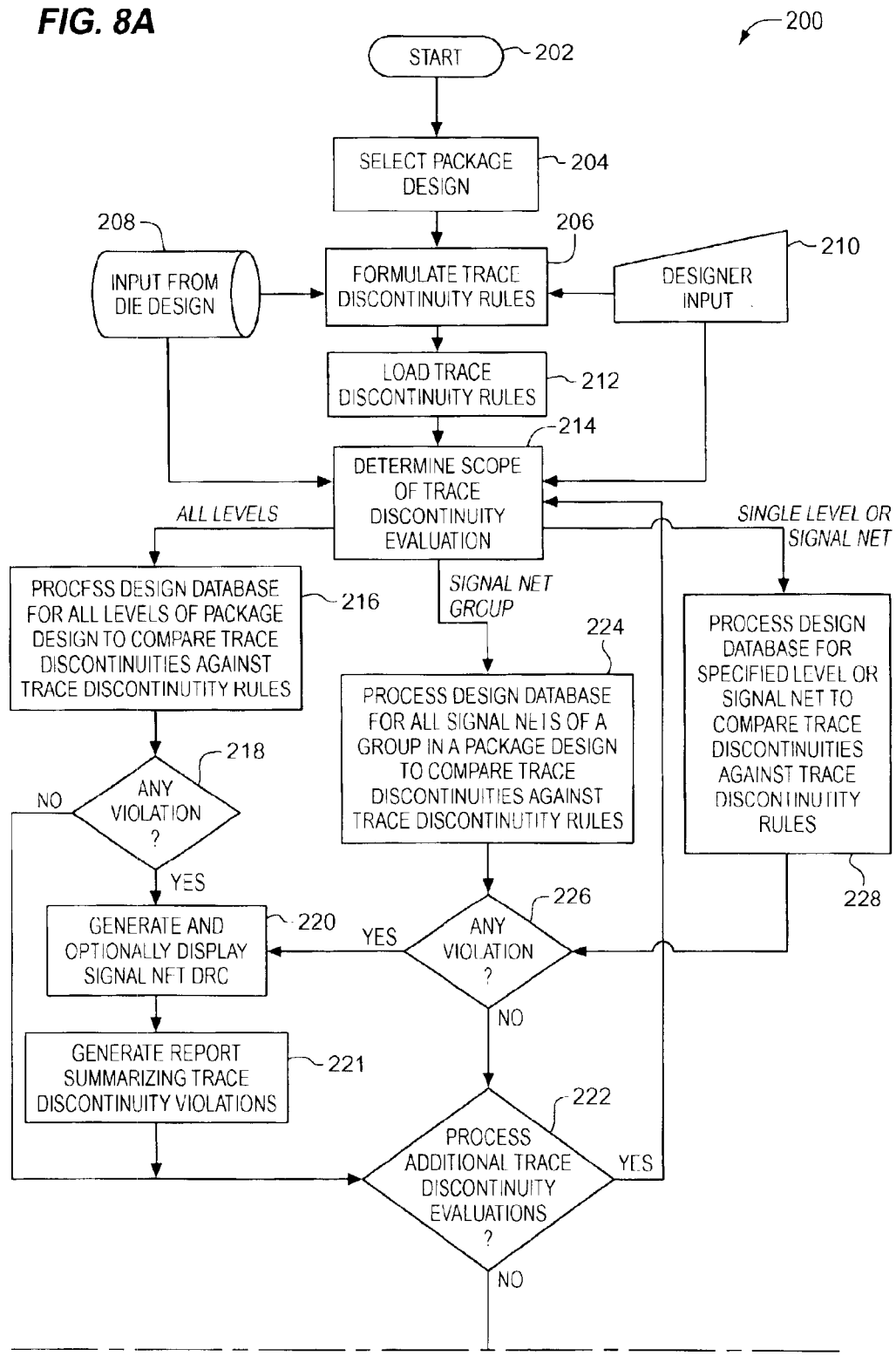
FIG. 8A and FIG. 8B show a flowchart illustrating one method for processing a package design to evaluate trace discontinuities.
Figure 8B:
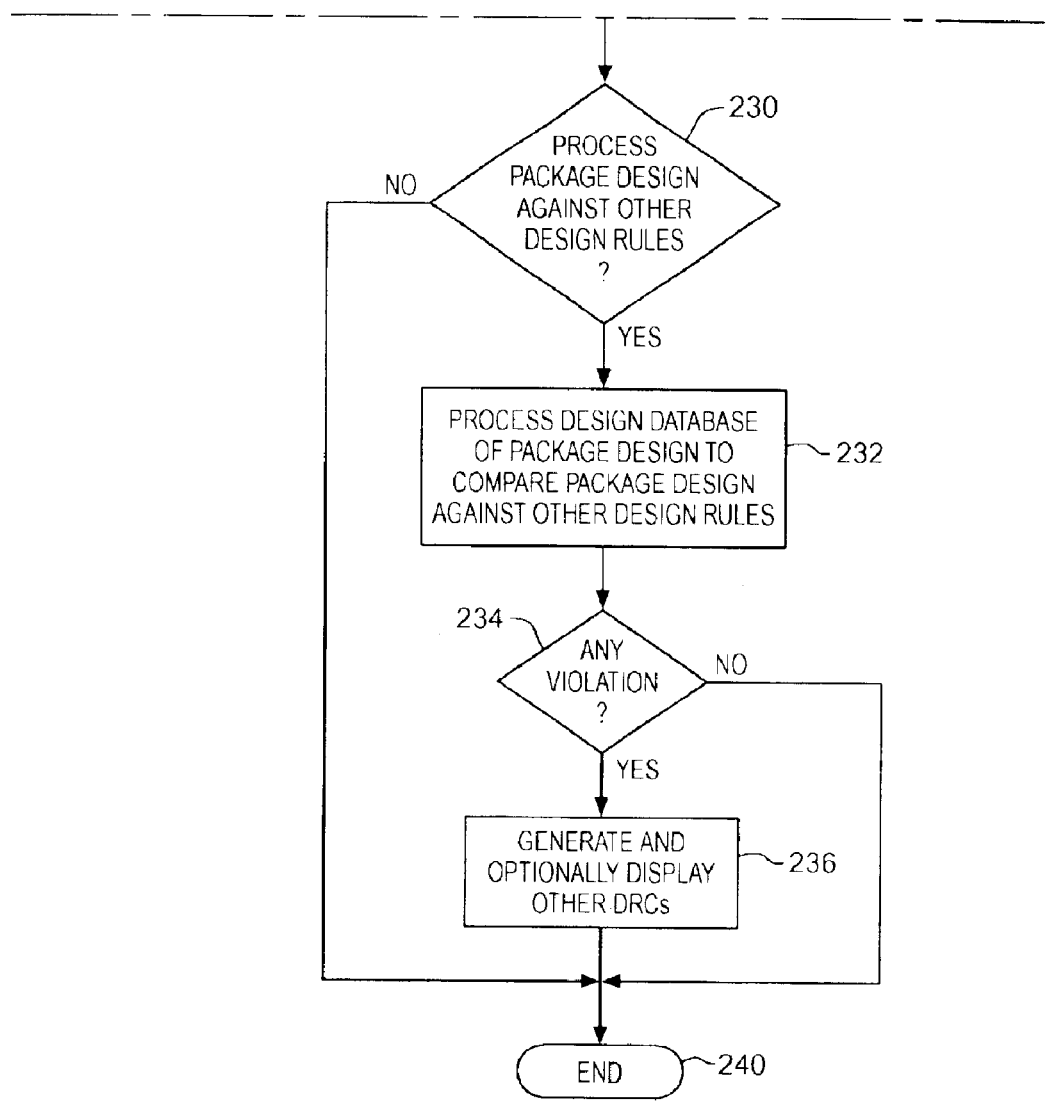

Trace discontinuity software 101 processes design database 150 and utilizes trace discontinuity rules 153 to generate one or more signal net Design Rule Checks (DRCs) 155. One DRC 155A is illustratively shown in FIG. 5, indicating a violation of trace discontinuity rules 153. DRC 155A for example illustrates that one discontinuity 156A, between traces 144A and 144B, forms an acute angle $\Theta$ which is not allowed by trace discontinuity rules 153. All violations of the trace discontinuity rules may be summarized in a report 157 managed by trace discontinuity software 101, as shown. FIG. 8A and FIG. 8B describe the operation of system 100 in its generation and utilization of trace discontinuity rules 153 and DRCs 155. Illustratively, a trace discontinuity rule may be stated textually as follows: each signal net in a group of signal nets cannot have more or fewer trace discontinuities than any other signal net within the group. This illustrative rule ensures that each signal net has an identical number of trace discontinuities. A DRC 155 may also be a textual indicator, for example a statement written to report 157. Illustratively, such a textual DRC 155 may for example state: DRC 155A=signal net 130 has an unallowable trace discontinuity exceeding thirty degrees, at trace 144, level I(3).

Figure 6:
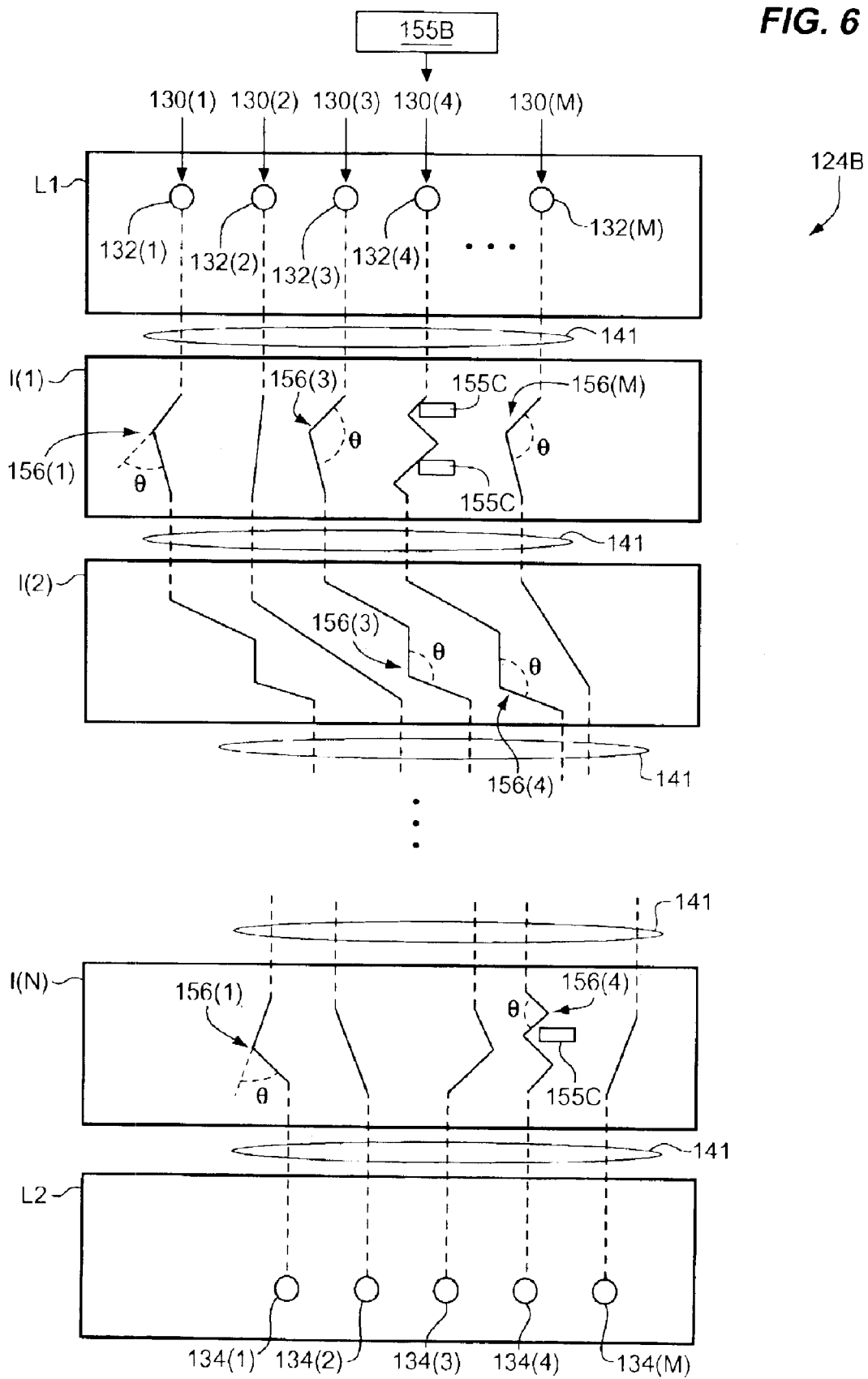
FIG. 6 illustrates one other package design processed by the system of FIG. 4.

FIG. 6 illustrates an (N+2)-level package design 124B; L1 and L2 represent the top and bottom levels, respectively, with N intermediate levels I(1), I(2) . . . I(N), where N is an integer value greater than or equal to one. Each level of package design 124B is shown in a flat planar view, for purposes of illustration, even though it should be clear to those skilled in the art that levels L1, I(1)–I(N), L2 combine to form a modular package design. Model 124B also has a plurality of signal nets 130(1), 130(2), 130(3), 130(4) . . . 130(M) formed between respective input and output connectors 132, 134, as shown. The vias connecting signal nets 130 between levels are illustratively shown as dotted lines 141. The traces of signal nets 130 may have one or more discontinuities 156, as shown. Each discontinuity 156 forms a turning angle $\theta$ in the trace which, in one embodiment, is preferably less than an acute angle such as thirty degrees. The "turning angle" $\theta$ is the deviation angle of a trace relative to an un-deviated straight line, in the input-to-output direction of the respective signal net.

As described in FIG. 8A and FIG. 8B, system 100 of FIG. 4 may for example generate one or more DRCs 155 when angle $\theta$ exceeds a maximum turning angle set forth in trace discontinuity rules 153. Discontinuity rules 153 may operate on one or a plurality of relationships between multiple signal nets 130, as described in FIG. 8A and FIG. 8B.

Figure 7:
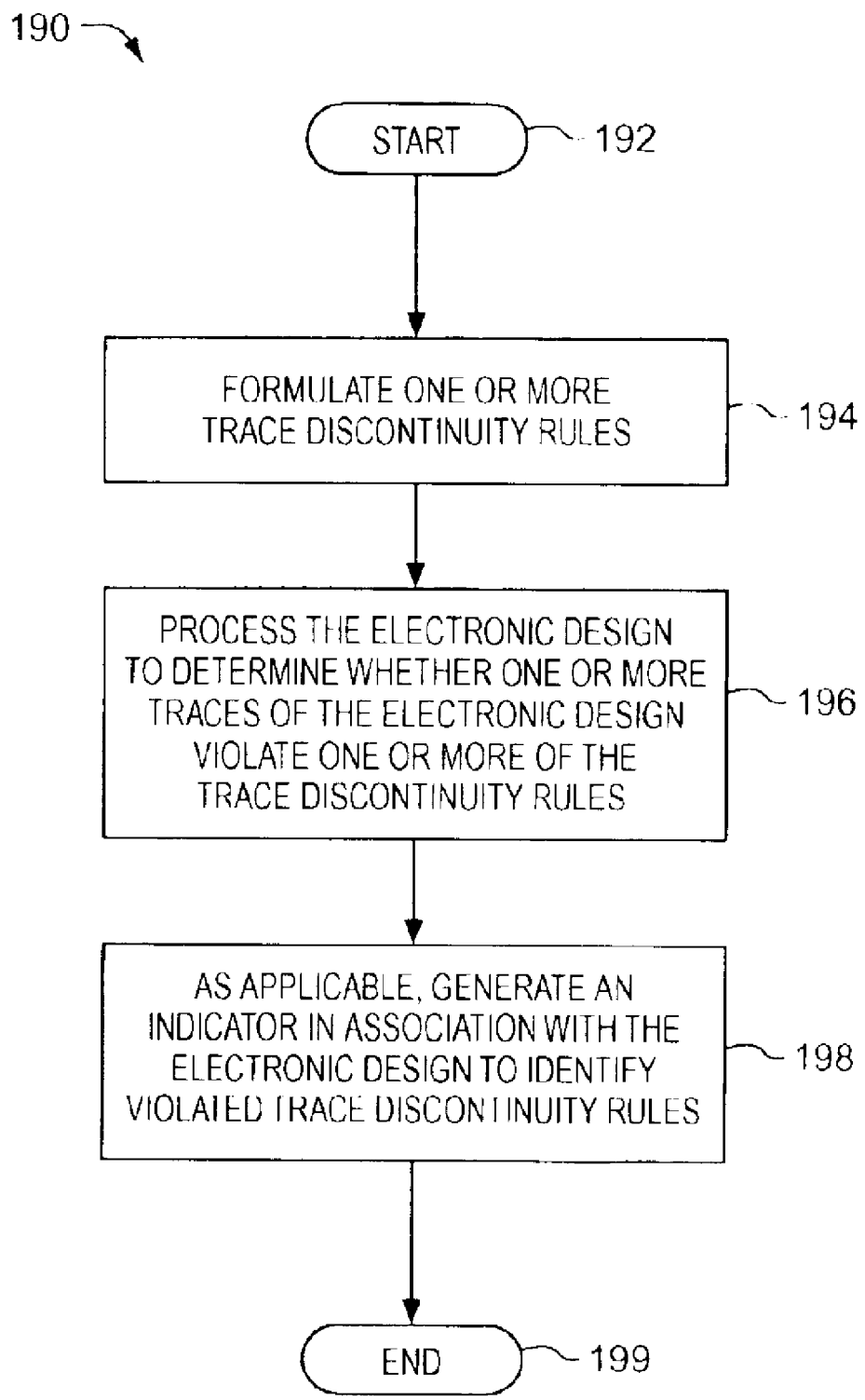
FIG. 7 is a flowchart illustrating one process for evaluating signal trace discontinuities in an electronic design.

FIG. 7 is a flowchart illustrating one process 190 for evaluating signal trace discontinuities in an electronic design. After start 192, one or more trace discontinuity rules are formulated, in step 194. In step 196, the electronic design is processed to determine whether one or more traces of the electronic design violate one or more of the trace discontinuity rules. In step 198, an indicator (e.g., a signal net DRC) is generated in association with the electronic design to identify violated trace discontinuity rules, if any. Process 190 terminates at 199.

FIG. 8A and FIG. 8B show a flowchart illustrating one process 200 for generating and utilizing trace discontinuity rules (e.g., rules 153) and signal net DRCs (e.g., DRCs 155) with respect to a package design (e.g., design 124). System 100 of FIG. 4 for example utilizes process 200 to generate DRC 154A and DRC 155A in FIG. 5.

After start 202, a package design is selected in step 204; by way of example, step 204 may automatically select a current package design 124 being created by CAD software 112.

At step 206, trace discontinuity rules are created. Process 200 shows two exemplary techniques for creating trace discontinuity rules. In one example, trace discontinuity rules are formulated 206 by processing input specifications of the die which couples with the package design, as indicated by direct data input 208. In another example, a designer manually formulates 206 trace discontinuity rules, as indicated by user input 210. The formulated trace discontinuity rules are loaded to computer memory (e.g., memory 122, FIG. 4) in step 212, so that the trace discontinuity rules may operate with the package design selected in step 204. Trace discontinuity software 101, FIG. 4, may perform or facilitate some or all of steps 206–212.

Step 214 determines the scope of subsequent trace discontinuity evaluations. Illustratively, this determination 214 may derive from direct data input 208 associated with die specifications, or from user inputs 210. The outputs of step 214 associate with the scope determined in step 214.

In one example, a designer selects "all levels" of the package design to be processed for validation against the trace discontinuity rules. Computer 114 of system 100 responds to the request to evaluate all levels and processes design database 150 to evaluate all traces within each level of design 124, as indicated by step 216. For example, if model 124A of FIG. 5 were selected, then all traces of levels L1, L2, I(1)–I(3) are evaluated and compared against trace discontinuity rules 153.

Step 218 is a decision. If a trace violates one of the trace discontinuity rules, a signal net DRC 155 is generated (and optionally displayed with model 124A, for example, as DRC 155A), as indicated by step 220. Optionally, a designer may also publish a report summarizing violations of the trace discontinuity rules, as in step 221. If no violation occurs, processing continues with step 222.

In another option from step 214, a group of signal nets of a package design ("signal net group") are to be processed for validation against the trace discontinuity rules. Computer 114 of system 100 responds to the request to evaluate all signal nets in the group and processes design database 150 to evaluate all traces within the grouped signal nets, as indicated by step 224. For example, if signal nets 130(1), 130(2), 130(3), 130(4) . . . 130(M) of model 124B, FIG. 6, are selected for the scope of the evaluation, then all traces of signal nets 130(1), 130(2), 130(3), 130(4) . . . 130(M) are evaluated and compared against trace discontinuity rules 153. Step 226 is a decision. If a trace violates one of the trace discontinuity rules, a signal net DRC 155 is generated (and optionally displayed with model 124A, for example, as DRC 155A), as indicated by step 220. If no violation occurs, processing continues with step 222.

In one example, such a group of signal nets are evaluated to ensure that electrical signals processed through the various signal nets maintain similar electrical properties. Signal properties change depending upon the number of trace discontinuities experienced through a signal net. Signal properties also change depending upon the magnitude of each turning angle of a particular signal net. Therefore, trace discontinuity rules 153 may specify, for example, that any signal net in a group cannot have more than six trace discontinuities that exceed a thirty-degree turning angle as compared to any other signal net of the group. For example, in FIG. 6, signal net 130(2) of the group of signal nets 130(1)–130(M) has no trace discontinuities in levels I(1) . . . I(N), and yet signal net 139(4), on the other hand, has nine trace discontinuities 156(4); seven of these discontinuities 156(4) have a turning angle θ larger than thirty degrees, for example. Accordingly, step 226 determines that a violation exists and step 220 generates a signal trace DRC 155, indicated as signal trace DRC 155B in FIG. 6.

In another example, the group of signal nets may be selected and compared to trace discontinuity rules 153 which state that no trace may have a discontinuity with a turning angle exceeding thirty degrees. In this example, DRCs 155C are generated 220 for each violating trace discontinuity of signal net 130(4), and for each other signal net of the group with a violating trace discontinuity.

A designer may also select a single level or signal net for processing, as indicated by step 228. If 226 a violation exists, a DRC is generated for the level or signal net, as in step 220. If no violation exists, processing continues with step 222.

Step 222 is a decision. If additional trace discontinuity evaluations (with differing scope) are designated, step 214 repeats; otherwise, process 200 continues with step 230. Step 230 is a decision. If the package design is to be evaluated against other design rules (e.g., rules 154, FIG. 4), step 232 processes the design database relative to the other design rules. Step 234 is a decision. If other DRCs 154 exist due to violation of the other design rules, process 200 continues with step 236; otherwise process 200 ends at step 240. In step 236, one or more other DRCs (e.g., DRC 154A, FIG. 4) may be generated and optionally displayed.

The following pseudo code illustrates one example for evaluating signal trace discontinuities in a package design.

---

```
*Pseudo Code*
VARIABLES:
Die_Specification :         (Structure to contain specifics for die selected)
Die_Specification_File :    (Name of file containing die specifications)
Package_Design_List :       (Structure to contain a list of all design elements from the design
                             database)
Design_Element_List :       (Structure to contain a list of Design Package Elements selected from
```

```
                                      the Package_Design_List)
Design_Name :                         (Variable identifying the specific design to be validated)
Designer_Signal_Net :                 (Variable to store the identifier for the signal net selected by the
                                      designer)
Design_Rule_List :                    (Structure to contain a list of trace discontinuity rules)
Design_Rule_Checks_List :             (Structure to contain a list of design rule violations)
{Load Specification for the die used by the package into a list variable.}
Die_Specification := LoadDieSpecificationFromFile(Die_Specification_File);
{Load the package design from the package design database}
Package_Design_List := LoadPackageDesign(Design_Name);
{Generate die specific design rules from the die specification}
Design_Rule_List := GenerateDesignRules(Die_Specification);
{Add any design rules input by the designer}
Design_Rule_List := Design_Rule_List + Input_Designer_Rules( );
{Input the signal net identification as selected by the designer for this check}
Designer_Signal_Net := Input_Designer_Signal_Net_Choice( );
{Select a single signal net from the package design, as specified by the designer}
Design_Element_List := SelectDesignElementsForChecking(Package_Design_List,
                                                      Single_Signal_Net,
                                                      Designer_Selected_Net);
{Empty the list for storing the DRCs detected}
Design_Rule_Check_List := EMPTY;
{The Design_Rule_Check function tests each Design Element against all trace
 discontinuity rules in the Design_Rule_List, returning a DCR if a check fails. The
 DRC is added to the Design_Rule_Checks_List for later processing.}
Design_Rule_Checks_List := Design_Rule_Check(Design_Element_List, Design_Rule_List);
IF COUNT_ITEMS_IN_LIST(Design_Rule_Checks_List) > 0 THEN
BEGIN
    {Generate a DRC report for all detected DCRs}
    Generate_Design_Rule_Check_Report(Design_Rule_Checks_List);
    IF Design_Rule_Check_Display_Selected THEN
    BEGIN
        {If the DRCs are to be displayed on screen, the
        Generate_Design_Rule_Check_Display function sends the detected DCRs
        for output on the display}
        Generate_Design_Rule_Check_Display(Design_Rule_Checks_List);
    END IF;
END IF;
```

In this example, the Design_Element_List contains a list of all design elements in a single signal net. The Design_Rule_Check function steps through all design rules in the Design_Rule_List, and tests each design element in the Design Element List for signal trace continuity. Only pseudo code for one Signal_Trace_Discontinuity_Rule is shown in the case statement for clarity. The pseudo code for the Signal_Trace_Discontinuity_Rule checks for continuity problems in the single signal net stored in the Design Element List, and violated discontinuities are reported in a DRC returned by the function.

```
FUNCTION Design_Rule_Check(Design_Element_List, Design_Rule_List) : DRC_List;
VARIABLES
Design_Rule_Index :      (Index variable used to step through Design_Rule_List)
Design_Element_Index :   (Index variable used to step through Design Element List)
DRC_List :               (List to build the Returned DRCs)
BEGIN
    DRC_List := EMPTY;    {Clear the return DCR list}
    {Step through the design rules in the Design Rule List and check each design
    element in the Design Element List to which the rule applies. Accumulate DRCs
    in the DRC_List to be returned at the end of the function.}
    FOR Design_Rule_Index := 1 to COUNT_ITEMS_IN_LIST(Design_Rule_List) DO
    BEGIN
        CASE Design_Rule_List[Design_Rule_Index].Type OF
        ...
        Signal_Trace_Discontinuity_Rule:
        BEGIN
            {Step through the single net list and check trace continuity}
            FOR Design_Element_Index:= 1 to
                COUNT_ITEMS_IN_LIST(Design_Element_List) - 1 DO
            BEGIN
                {Check the continuity of the trace}
                IF ComputeAngle(Design_Element_List[Design_Element_Index],
                        Design_Element_List[Design_Element_Index+1]) >
                    Design_Rule_List[Design_Rule_Index].MaxContinuityAngle THEN
                BEGIN
                    {The rule failed, so add the DCR to the DCR list to be returned on
```

```
        completion of the function}
            DRC_List := DRC_List + DRC(Design_Rule_List[Design_Rule_Index].Type);
        END IF;
      END FOR;
    END Signal_Trace_Discontinuity_Rule;
    ...
    END CASE;
  END FOR;
  RETURN DRC_List; {Return the results for the Design Rule Check function}
END FUNCTION;
```

Changes may be made in the above methods and systems without departing from the scope hereof. It should thus be noted that that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for evaluating signal trace discontinuities in an electronic design of the type having one or more traces, comprising:
   formulating one or more trace discontinuity rules;
   processing the electronic design to determine whether the traces violate the trace discontinuity rules; and
   generating an indicator associated with the electronic design to identify violated trace discontinuity rules, the electronic design comprising a package design, the step of formulating comprising the step of formulating one or more group trace discontinuity rules for a group of signal nets of the package design, wherein the step of processing comprises the step of processing the group of signal nets to determine whether traces of the group of signal nets violate the group trace discontinuity rules.

2. The method of claim 1, the step of generating comprising the step of generating a DRC for each violation of the group trace discontinuity rules.

3. The method of claim 1, wherein the step of processing the group of signal nets comprises the steps of locating one signal net, within the group, that has a least number of trace discontinuities, and then evaluating each other signal net in the group as to whether each other signal net violates the group trace discontinuity rules.

4. The method of claim 3, further comprising the step of determining whether each other signal net has more than six trace discontinuities that have a turning angle greater than thirty degrees.

5. The method of claim 1, the group trace discontinuity rules defining that no signal net within the group can have more than X trace discontinuities greater than any othersignal net within the group, X being an integer greater than or equal to one.

6. The method of claim 5, the group trace discontinuity rules defining that no signal net within the group can have a trace discontinuity with a turning angle greater than Y degrees, Y being an integer value greater than or equal to ten.

7. The method of claim 6, wherein X is six and Y is thirty.

8. A method for evaluating signal trace discontinuities in an electronic design of the type having one or more traces, comprising:
   formulating one or more trace discontinuity rules;
   processing the electronic design to determine whether the traces violate the trace discontinuity rules; and
   generating an indicator associated with the electronic design to identify violated trace discontinuity rules, the step of generating an indicator comprising the step of graphically depicting a DRC on a graphical user interface illustrating the electronic design.

9. A method for evaluating signal trace discontinuities in an electronic design of the type having one or more traces, comprising:
   formulating one or more trace discontinuity rules;
   processing the electronic design to determine whether the traces violate the trace discontinuity rules; and
   generating an indicator associated with the electronic design to identify violated trace discontinuity rules, the trace discontinuity rules defining that a trace discontinuity can not have a turning angle greater than Y degrees, Y being an integer value greater than or equal to ten.

10. The method of claim 9, wherein Y is thirty.

11. A software product comprising instructions, stored on computer-readable media, wherein the instructions, when executed by a computer, perform steps for determining signal trace discontinuities in an electronic design, comprising:
   instructions for determining instances of trace discontinuities within the electronic design;
   instructions for comparing the instances to one or more trace discontinuity rules;
   instructions for generating an indicator identifying violations of the trace discontinuity rules; and
   instructions for generating a report summarizing violations of the trace discontinuity rules.

* * * * *